(12) United States Patent
Lai et al.

(10) Patent No.: US 9,742,972 B2
(45) Date of Patent: Aug. 22, 2017

(54) CAMERA MODULE AND ASSEMBLING METHOD THEREOF

(71) Applicant: Primax Electronics Ltd., Neihu, Taipei (TW)

(72) Inventors: Chin-Ding Lai, Taipei (TW); Ta-Sheng Yu, Taipei (TW); Han-Kai Wang, Taipei (TW)

(73) Assignee: PRIMAX ELECTRONICS LTD., Neihu, Taipei (TW)

( * ) Notice: Subject to any disclaimer, the term of this patent is extended or adjusted under 35 U.S.C. 154(b) by 0 days.

(21) Appl. No.: 15/077,829

(22) Filed: Mar. 22, 2016

(65) Prior Publication Data
US 2017/0201660 A1 Jul. 13, 2017

(30) Foreign Application Priority Data

Jan. 12, 2016 (TW) .............................. 105100789 A

(51) Int. Cl.
*H04N 5/225* (2006.01)
*H04N 5/232* (2006.01)
*H05K 1/11* (2006.01)
*H05K 3/30* (2006.01)
*H05K 3/32* (2006.01)
(Continued)

(52) U.S. Cl.
CPC ......... *H04N 5/2257* (2013.01); *H04N 5/2254* (2013.01); *H04N 5/23241* (2013.01); *H05K 1/117* (2013.01); *H05K 1/144* (2013.01); *H05K 3/368* (2013.01); *H05K 2201/041* (2013.01); *H05K 2201/049* (2013.01); *H05K 2201/10121* (2013.01)

(58) Field of Classification Search
CPC ............. H04N 5/2254; H04N 5/23241; H04N 5/2257; H05K 1/117; H05K 1/144; H05K 3/328; H05K 3/368; H05K 3/30; H05K 3/32
USPC ..... 348/373, 374, 294, 335, 340; 250/208.1, 250/239; 396/55, 133, 144, 529, 535; 439/67, 71, 330, 566, 736, 607.1–607.59; 257/432–434, 680; 359/811, 819, 823, 359/824; 385/14, 92, 93, 131, 88
See application file for complete search history.

(56) References Cited

U.S. PATENT DOCUMENTS 9,276,140 B1 * 3/2016 Tam .................. H01L 31/02002
2011/0044593 A1 * 2/2011 Kihara ................. G02B 6/4201
385/93
(Continued)

*Primary Examiner* — Tuan Ho
*Assistant Examiner* — Marly Camargo
(74) *Attorney, Agent, or Firm* — Kirton McConkie; Evan R. Witt

(57) ABSTRACT

A camera module includes a lens assembly, a power device with a first circuit board, a second circuit board and a welding element. The first circuit board is partially bent, and thus an electrical contact of the first circuit board is exposed to a lateral side of the power device. The second circuit board includes a conductive hole corresponding to the electrical contact. The conductive hole is exposed to a lateral side of the second circuit board. The welding element is installed on the lateral side of the power device and the lateral side of the second circuit board. The welding element is contacted with the electrical contact and the conductive hole, so that the first circuit board and the second circuit board are electrically connected with each other.

10 Claims, 6 Drawing Sheets

(51) Int. Cl.
*H05K 1/14* (2006.01)
*H05K 3/36* (2006.01)

(56) References Cited

U.S. PATENT DOCUMENTS

| | | | | |
|---|---|---|---|---|
| 2011/0317965 A1* | 12/2011 | Fujimura | ............... | G02B 6/421 |
| | | | | 385/93 |
| 2012/0236248 A1* | 9/2012 | Kang | .................... | G02B 7/022 |
| | | | | 349/200 |
| 2015/0229843 A1* | 8/2015 | Shimizu | .................. | G03B 5/00 |
| | | | | 348/222.1 |
| 2016/0246029 A1* | 8/2016 | Kim | ........................ | G02B 7/08 |

* cited by examiner

CAMERA MODULE AND ASSEMBLING METHOD THEREOF

FIELD OF THE INVENTION

The present invention relates to a camera module, and more particularly to a camera module with a zooming function.

BACKGROUND OF THE INVENTION

Recently, mobile communication devices, personal digital assistants (PDA) or other portable electronic devices with image-shooting functions are widely used. Since the portable electronic devices are carried easily, the image-shooting functions become basic functions of the portable electronic devices. In other words, the portable electronic device is equipped with a camera module. Generally, the camera module comprises a lens assembly and a sensing chip. After ambient light beams pass through the camera module, the ambient light beams are refracted. The sensing chip has a sensing area. When the ambient light beams passing through the camera module are imaged on the sensing area, an image is generated.

The structure of a conventional camera module will be illustrated as follows. FIG. 1 is a schematic exploded view illustrating a conventional camera module. As shown in FIG. 1, the camera module 1 comprises a lens assembly 10, a voice coil motor 11 and a printed circuit board 12. The lens assembly 10 and the voice coil motor 11 are combined together in order to shoot an object to acquire an image of the object. The voice coil motor 11 comprises a flexible circuit board 111. The flexible circuit board 111 is located at a lateral side of the lens assembly 10. Moreover, plural first electrical contacts 112 on the flexible circuit board 111 are exposed to the lateral side of the lens assembly 10. The printed circuit board 12 comprises a sensing chip 121 and plural second electrical contacts 122. The sensing chip 121 is disposed on a surface of the printed circuit board 12. The function of the sensing chip 121 is similar to that mentioned above. The plural first electrical contacts 112 are located at a lateral side of the printed circuit board 12. Moreover, the plural first electrical contacts 112 are aligned with the plural first electrical contacts 112, respectively.

FIG. 2 is a schematic assembled view illustrating the conventional camera module. After the lens assembly 10, the voice coil motor 11 and the printed circuit board 12 are combined together, the resulting structure of the camera module 1 is shown in FIG. 2. After the voice coil motor 11 is placed on the printed circuit board 12, the plural first electrical contacts 112 on the flexible circuit board 111 and the plural second electrical contacts 122 on the printed circuit board 12 are close to each other. Moreover, plural welding elements 13 are located at the lateral side of the printed circuit board 12. The plural first electrical contacts 112 and the corresponding second electrical contacts 122 are connected with each other through the corresponding welding elements 13. Consequently, the plural first electrical contacts 112 and the corresponding second electrical contacts 122 are electrically connected with each other. After the electric connection between the voice coil motor 11 and the printed circuit board 12 is established, the camera module 1 is normally operated.

However, the conventional camera module 1 still has some drawbacks. Since the plural second electrical contacts 122 are located at the lateral side of the printed circuit board 12 and the welding elements 13 have to be installed on the lateral side of the printed circuit board 12, it is necessary to provide a reserved area 123 on the lateral side of the printed circuit board 12. Under this circumstance, the width T1 of the printed circuit board 12 is larger than the width T2 of the voice coil motor 11. Recently, the volume of the portable electronic device is gradually decreased, and the demands on the functions of the portable electronic device are gradually increased. Consequently, it is difficult to lay out electronic components in the inner space of the portable electronic device. That is, many electronic components cannot be effectively installed in the limited space of the portable electronic device. Due to the arrangement of the reserved area 123 of the printed circuit board 12, it is difficult to install the conventional camera module 1 in the inner space of the portable electronic device.

Therefore, there is a need of providing a camera module with reduced volume.

SUMMARY OF THE INVENTION

An object of the present invention provides a camera module with reduced volume.

In accordance with an aspect of the present invention, there is provided a camera module. The camera module includes a lens assembly, a power device with a first circuit board, a second circuit board and a welding element. The power device is connected with the lens assembly. The lens assembly is moved by the power device. The first circuit board has an electrical contact. The electrical contact is exposed to a lateral side of the power device. The second circuit board is disposed under the first circuit board, and includes a conductive hole corresponding to the electrical contact. The conductive hole is exposed to a lateral side of the second circuit board. The welding element is installed on the lateral side of the power device and the lateral side of the second circuit board. The welding element is contacted with the electrical contact and the conductive hole, so that the first circuit board and the second circuit board are electrically connected with each other.

In accordance with another aspect of the present invention, there is provided an assembling method of a camera module. The assembling method includes the following steps. Firstly, a power device is provided. A first circuit board of the power device has an electrical contact. The electrical contact is exposed to a lateral side of the power device. Then, a second circuit board is provided. The second circuit board has a conductive hole. The conductive hole is exposed to a lateral side of the second circuit board. Then, a welding element is installed on the lateral side of the power device and the lateral side of the second circuit board, and the welding element is contacted with the electrical contact and the conductive hole. The first circuit board and the second circuit board are electrically connected with each other through the welding element.

From the above descriptions, the present invention provides the camera module. The plural conductive holes are formed in an edge of the second circuit board. The edge of the second circuit board is partially cut according to the size of the power device. Consequently, the cut conductive holes are exposed to the lateral side of the second circuit board. After the second circuit board is cut, the size of the second circuit board is substantially equal to the size of the power device. In comparison with the conventional technology, it is necessary to provide a reserved area on the lateral side of the second circuit board. Consequently, the combination of the second circuit board and the power device has reduced volume. Since the overall volume of the camera module is reduced, the camera module can be installed in the inner space of the portable electronic device without difficulty.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

For solving the drawbacks of the conventional technology, the present invention provides a camera module. The structure of the camera module of the present invention will be illustrated as follows.

Figure 1:
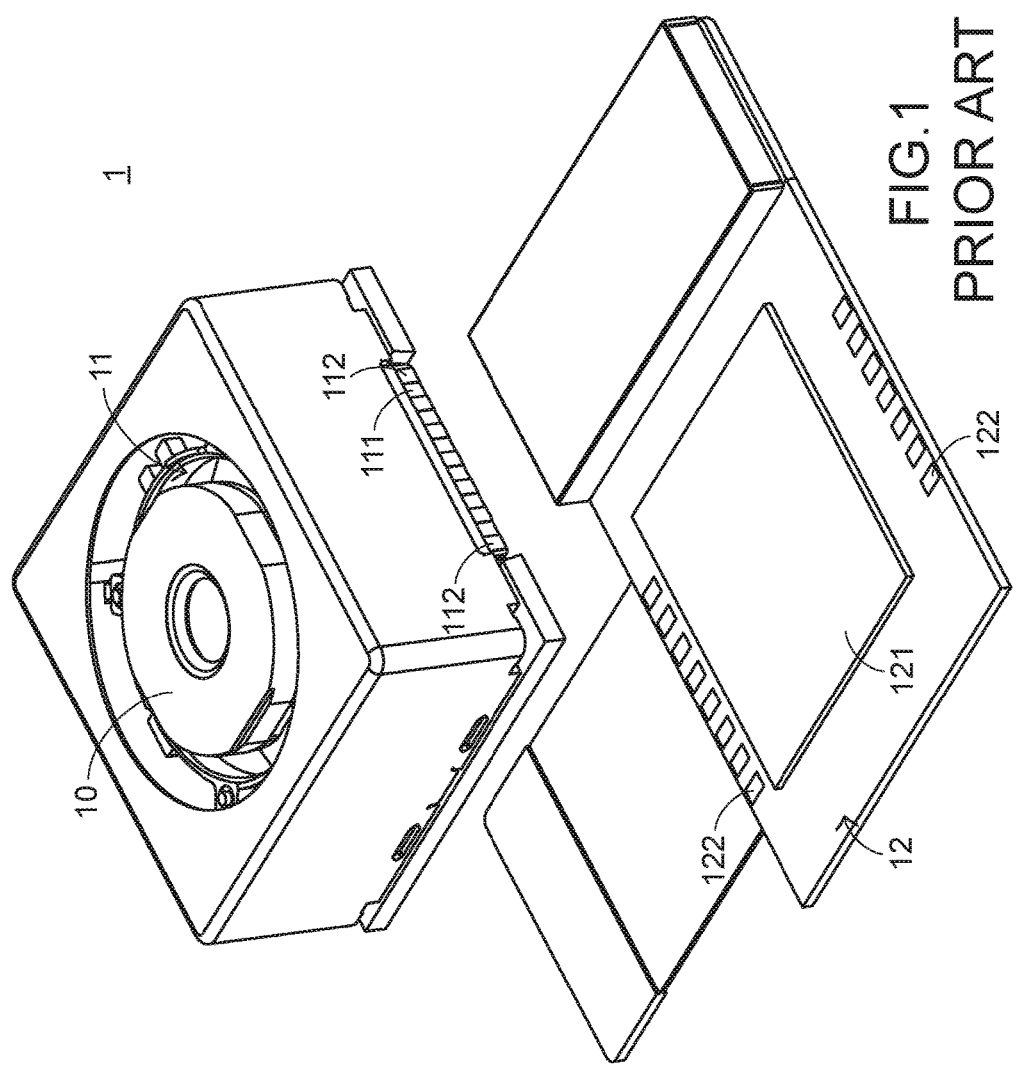
FIG. 1 is a schematic exploded view illustrating a conventional camera module.
Figure 2:
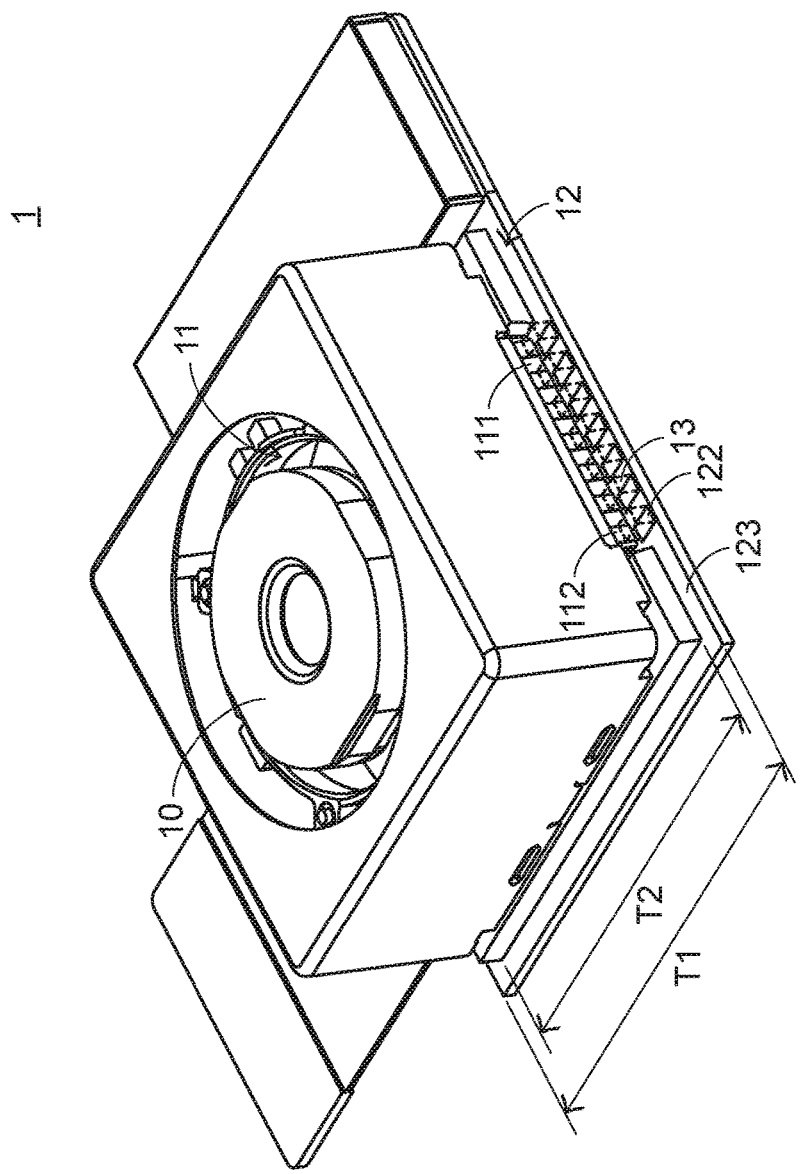
FIG. 2 is a schematic assembled view illustrating the conventional camera module.
Figure 3:
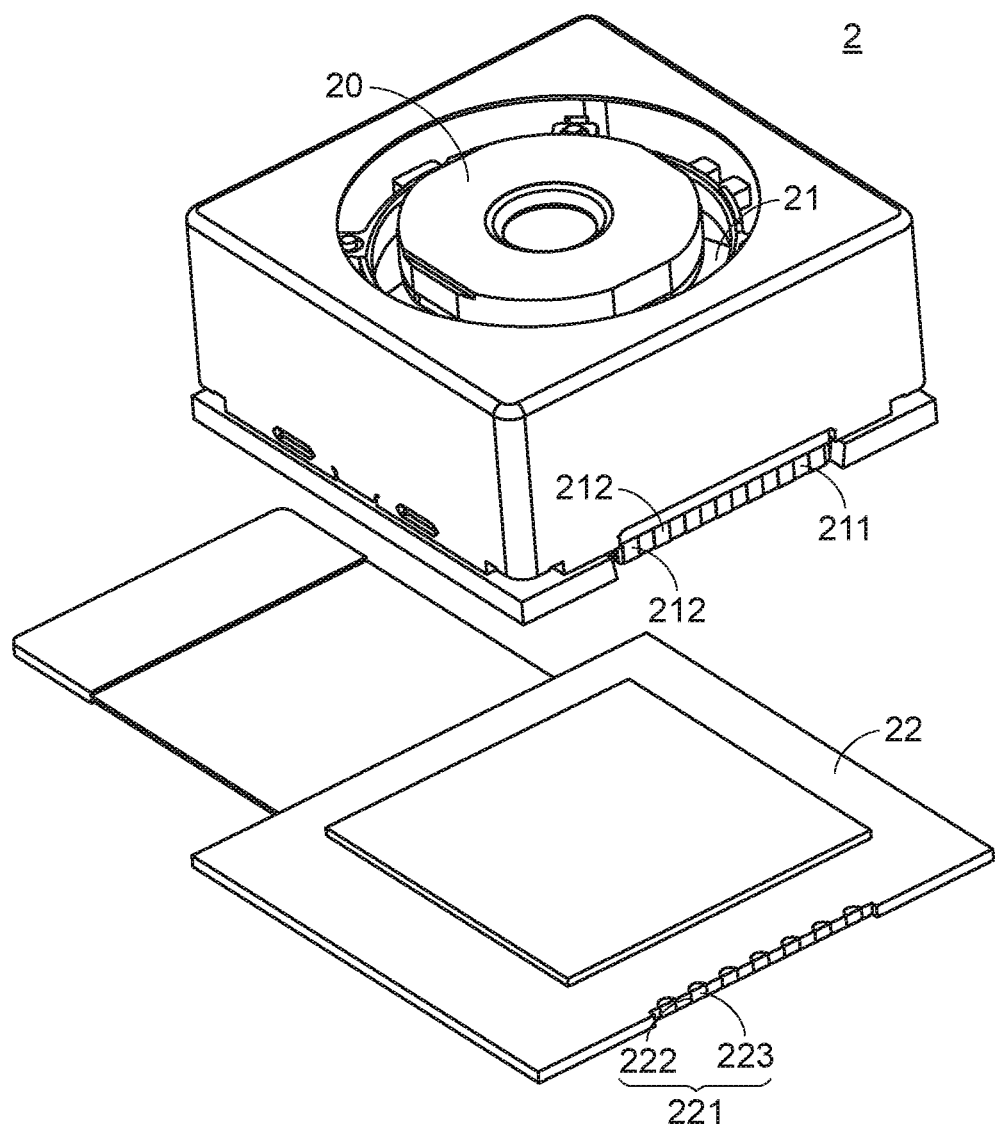
FIG. 3 is a schematic exploded view illustrating a camera module according to an embodiment of the present invention.
Figure 4:
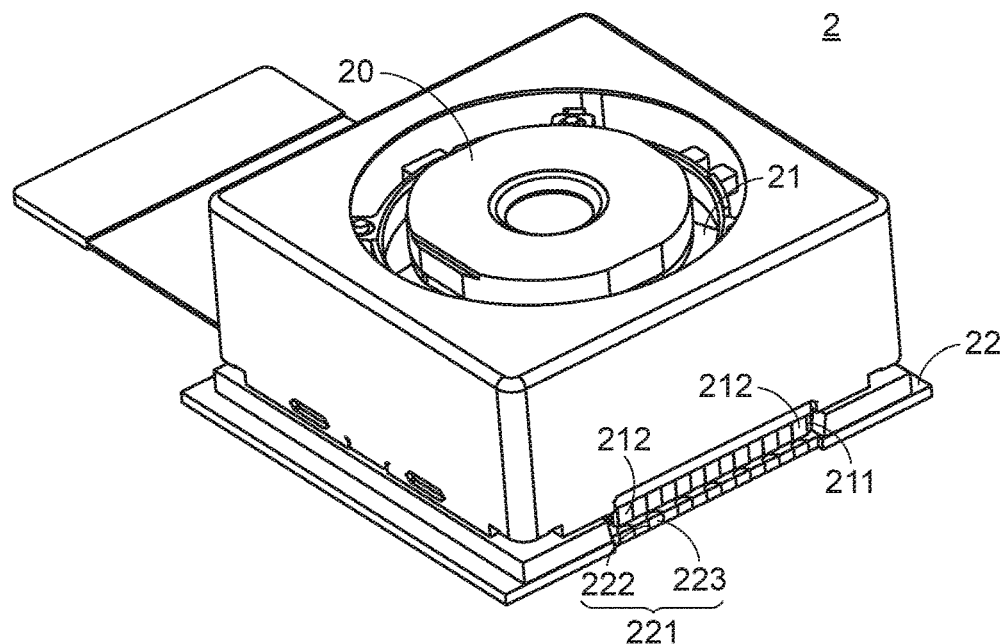
FIG. 4 is a schematic assembled view illustrating a power device and a second circuit board of the camera module according to the embodiment of the present invention.

FIG. 3 is a schematic exploded view illustrating a camera module according to an embodiment of the present invention. FIG. 4 is a schematic assembled view illustrating a power device and a second circuit board of the camera module according to the embodiment of the present invention. The camera module 2 comprises a lens assembly 20, a power device 21 with a first circuit board 211, a second circuit board 22 and plural welding elements 23. The structure and function of the lens assembly 20 are similar to those of the lens assembly 10 of the conventional camera module, and are not redundantly described herein. The power device 21 is connected with the lens assembly 20. The power device 21 can move the lens assembly 20 along an axial direction. The first circuit board 211 of the power device 21 is located at a bottom side of the power device 21. Moreover, the first circuit board 211 comprises plural electrical contacts 212. The first circuit board 211 is partially bent. In addition, the plural electrical contacts 212 are disposed on the bent part of the first circuit board 211. Consequently, the plural electrical contacts 212 are exposed to a lateral side of the power device 21. In an embodiment, the power device 21 is a voice coil motor, and the first circuit board 211 is a flexible circuit board.

The second circuit board 22 is disposed under the first circuit board 211. Moreover, the second circuit board 22 has plural conductive holes 221 corresponding to the plural electrical contacts 212. The plural conductive holes 221 are exposed to a lateral side of the second circuit board 22. Each conductive hole 221 comprises an opening 222 and a conductive structure 223. The opening 222 runs through the second circuit board 22. Moreover, the opening 222 is located at the lateral side of the second circuit board 22. The conductive structure 223 is inserted into the corresponding opening 222. As shown in FIG. 4, the plural openings 222 and the plural conductive structures 223 are exposed to the lateral side of the second circuit board 22. An example of the second circuit board 22 includes but is not limited to a rigid-flex board, a ceramic substrate, a FR4 copper clad laminate or a FR5 copper clad laminate.

Figure 5:
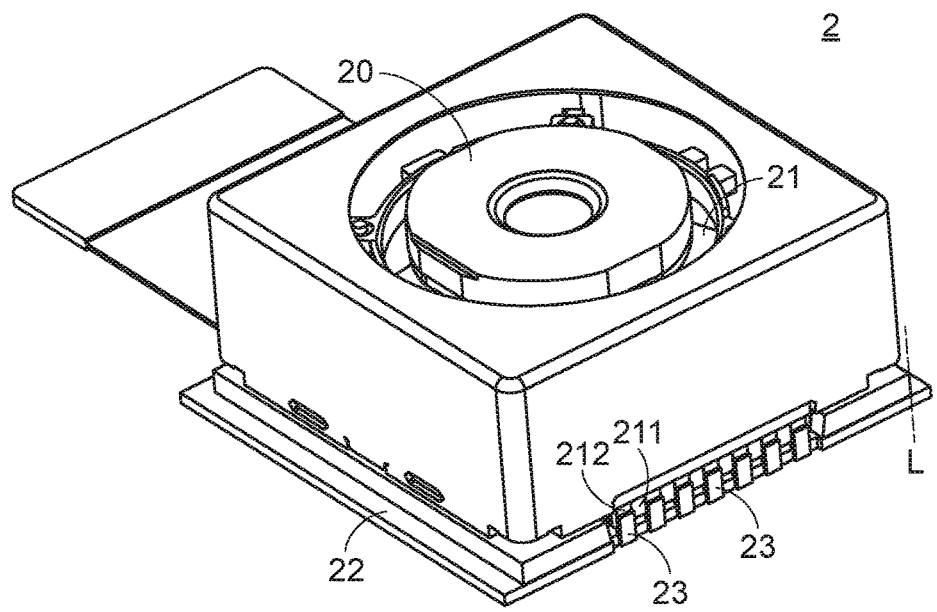
FIG. 5 is a schematic assembled view illustrating the camera module according to the embodiment of the present invention.

For establishing the electric connection between the first circuit board 211 and the second circuit board 22, plural welding elements 23 are installed on the lateral side of the power device 21 and the lateral side of the second circuit board 22. Moreover, the plural welding elements 23 are contacted with the corresponding electrical contacts 212 and the conductive structures 223 of the corresponding conductive holes 221. After the electrical contacts 212 are electrically connected with the corresponding conductive holes 221, the electric connection between the first circuit board 211 and the second circuit board 22 is established. The resulting structure of the assembled camera module 2 is shown in FIG. 5.

Figure 6:
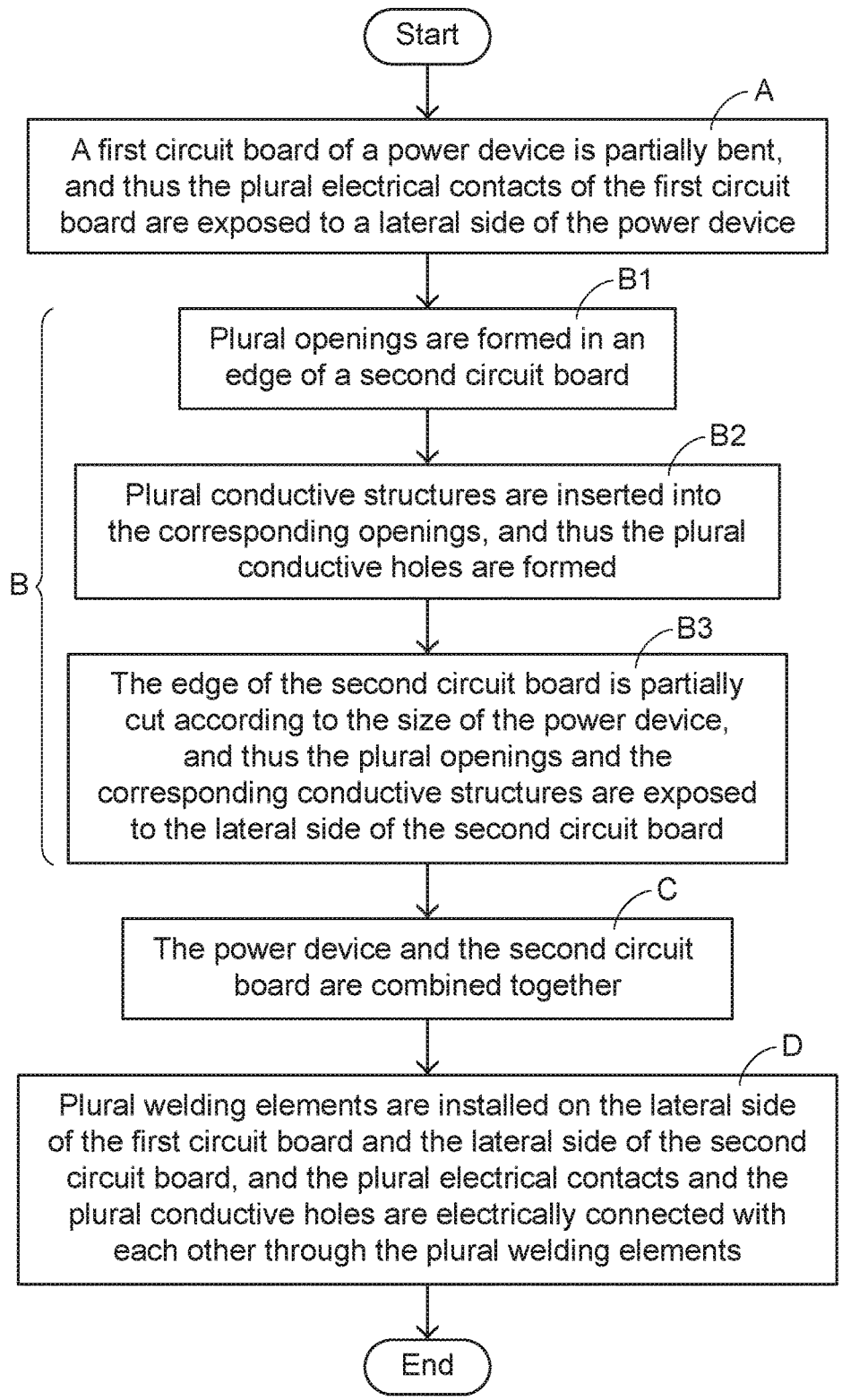
FIG. 6 is a flowchart illustrating an assembling method of a camera module according to a first embodiment of the present invention.

An assembling method of the camera module 2 will be illustrated as follows. FIG. 6 is a flowchart illustrating an assembling method of a camera module according to a first embodiment of the present invention. The assembling method comprises the following steps.

In a step A, a first circuit board of a power device is partially bent, and thus plural electrical contacts of the first circuit board are exposed to a lateral side of the power device. In a step B, plural conductive holes are formed in a second circuit board, and the plural conductive holes are exposed to a lateral side of the second circuit board. In a step C, the power device and the second circuit board are combined together. In a step D, plural welding elements are installed on the lateral side of the first circuit board and the lateral side of the second circuit board, and the plural electrical contacts and the plural conductive holes are electrically connected with each other through the plural welding elements, so that the electric connection between the first circuit board and the second circuit board is established.

The step B comprises the steps B1, B2 and B3. In the step B1, plural openings are formed in an edge of the second circuit board. In the step B2, plural conductive structures are inserted into the corresponding openings, and thus the plural conductive holes are formed. In the step B3, the edge of the second circuit board is partially cut according to the size of the power device, and thus the plural openings and the corresponding conductive structures are exposed to the lateral side of the second circuit board.

An implementation example of the assembling method of the camera module 2 will be illustrated as follows. Firstly, in the step A, the first circuit board 211 is partially bent, and thus the plural electrical contacts 212 of the first circuit board 211 are exposed to the lateral side of the power device 21. Then, in the step B1, the plural openings 222 are formed in the lateral side of the second circuit board 22. In the step B2, the plural conductive structures 223 are inserted into the corresponding openings 222, and thus the plural conductive holes 221 are formed. In the step B3, the edge of the second circuit board 22 is cut according to the size of the power device 21, and thus the plural openings 222 and the corresponding conductive structures 223 are exposed to the lateral side of the second circuit board 22. The cut edge of the second circuit board 22 is located at the lateral side of the second circuit board 22. After the edge of the second circuit board 22 is cut, the size of the second circuit board 22 is close to the size of the power device 21 (see FIG. 3).

Preferably but not exclusively, the size of the second circuit board 22 is equal to the size of the power device 21 after the edge of the second circuit board 22 is cut.

After the step B, the step C is performed. In the step C, the power device 21 is placed on the second circuit board 22, and thus the power device 21 is combined with the second circuit board 22 (see FIG. 4). Then, in the step D, the plural welding elements 23 are installed on the lateral side of the first circuit board 211 and the lateral side of the second circuit board 22, and the plural electrical contacts 212 and the plural conductive holes 221 are electrically connected with each other through the plural welding elements 23. Consequently, the electric connection between the first circuit board 211 and the second circuit board 22 is established. After the assembling method is completed, the resulting structure of the assembled camera module 2 is shown in FIG. 5.

Please refer to FIG. 5 again. The lateral side of the second circuit board 22 and the lateral side of the power device 21 are aligned with a dotted line L. In comparison with the conventional technology, it is necessary to provide a reserved area on the lateral side of the second circuit board 22. Consequently, the combination of the second circuit board 22 and the power device 21 has reduced volume. Since the overall volume of the camera module is reduced, the camera module can be installed in the inner space of the portable electronic device without difficulty.

In the step A of the assembling method of the above embodiment, the first circuit board 211 is located at the bottom side of the power device 21. For exposing the plural electrical contacts 212 to the lateral side of the power device 21, it is necessary to partially bend the first circuit board 211. It is noted that numerous modifications and alterations may be made while retaining the teachings of the invention. For example, in case that the first circuit board is located at the lateral side of the power device, the plural electrical contacts can be directly exposed to the lateral side of the power device. Under this circumstance, it is not necessary to partially bend the first circuit board.

Figure 7:
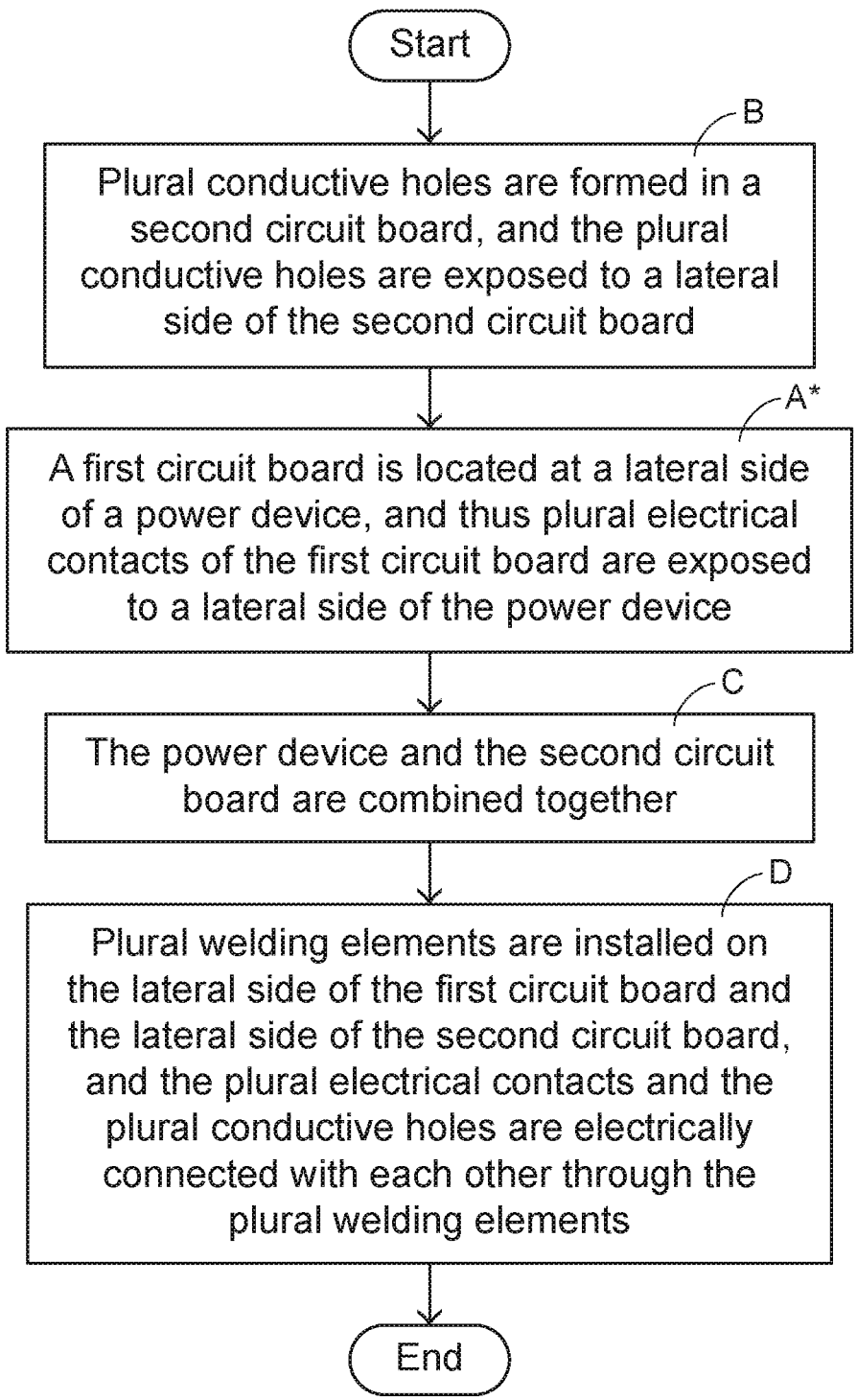
FIG. 7 is a flowchart illustrating an assembling method of a camera module according to a second embodiment of the present invention.

The present invention also provides another embodiment of the assembling method of the camera module. FIG. 7 is a flowchart illustrating an assembling method of a camera module according to a second embodiment of the present invention. The assembling method comprises the following steps. Firstly, in a step B, plural conductive holes are formed in a second circuit board, and the plural conductive holes are exposed to a lateral side of the second circuit board. Then, in a step A*, a first circuit board is located at a lateral side of a power device, and thus plural electrical contacts of the first circuit board are exposed to a lateral side of the power device. In a step C, the power device and the second circuit board are combined together. In a step D, plural welding elements are installed on the lateral side of the first circuit board and the lateral side of the second circuit board, and the plural electrical contacts and the plural conductive holes are electrically connected with each other through the plural welding elements, so that the electric connection between the first circuit board and the second circuit board is established.

Except that the step B is prior to the step A*, the other steps of assembling method of this embodiment are substantially identical to the corresponding steps of the assembling method of the first embodiment, and are not redundantly described herein. Moreover, the step B also comprises the steps B1-B3, which are identical to those of first embodiment. Except for the following aspects, the structures of the camera module of this embodiment are substantially identical to those of the camera module 2 of the above embodiment. In the step A* of this embodiment, the first circuit board is located at the lateral side of the power device, and thus the plural electrical contacts are exposed to the lateral side of the first circuit board. Consequently, in comparison with the step A of the first embodiment, it is not to bend the first circuit board.

From the above descriptions, the present invention provides the camera module. The plural conductive holes are formed in an edge of the second circuit board. The edge of the second circuit board is partially cut according to the size of the power device. Consequently, the cut conductive holes are exposed to the lateral side of the second circuit board. After the second circuit board is cut, the size of the second circuit board is substantially equal to the size of the power device. In comparison with the conventional technology, it is necessary to provide a reserved area on the lateral side of the second circuit board. Consequently, the combination of the second circuit board and the power device has reduced volume. Since the overall volume of the camera module is reduced, the camera module can be installed in the inner space of the portable electronic device without difficulty.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A camera module, comprising:
a lens assembly;
a power device connected with the lens assembly, wherein the lens assembly is moved by the power device, wherein the power device comprises a first circuit board, and the first circuit board has an electrical contact, wherein the electrical contact is exposed to a lateral side of the power device;
a second circuit board disposed under the first circuit board, and comprising a conductive hole corresponding to the electrical contact, wherein the conductive hole is exposed to a lateral side of the second circuit board; and
a welding element installed on the lateral side of the power device and the lateral side of the second circuit board, wherein the welding element is contacted with the electrical contact and the conductive hole, so that the first circuit board and the second circuit board are electrically connected with each other,
wherein the conductive hole comprises:
an opening located at the lateral side of the second circuit board, wherein the opening runs through the second circuit board; and
a conductive structure disposed within the opening, wherein the opening and the conductive structure are exposed to the lateral side of the second circuit board, wherein the welding element is located at the lateral side of the power device and the lateral side of the second circuit board, and contacted with the electrical contact and the conductive structure, so that the electrical contact and the conductive structure are electrically connected with each other.

2. The camera module according to claim 1, wherein the first circuit board is a flexible circuit board, and the second circuit board is a rigid-flex board, a ceramic substrate, a FR4 copper clad laminate or a FR5 copper clad laminate.

3. The camera module according to claim 1, wherein the power device is a voice coil motor.

4. The camera module according to claim 1, wherein the lateral side of the second circuit board and the power device are aligned with each other.

5. The camera module according to claim 1, wherein the first circuit board is disposed on a bottom side of the power device, and the first circuit board is partially bent, so that the electrical contact is exposed to the lateral side of the power device.

6. The camera module according to claim 1, wherein the first circuit board is disposed on the lateral side of the power device, and the electrical contact is exposed to the lateral side of the power device.

7. An assembling method of a camera module, the assembling method comprising steps of:
(A) providing a power device, wherein a first circuit board of the power device has an electrical contact, and the electrical contact is exposed to a lateral side of the power device;
(B) providing a second circuit board, wherein the second circuit board has a conductive hole, and the conductive hole is exposed to a lateral side of the second circuit board, wherein the step (B) comprises steps of:
  (B1) forming an opening in an edge of the second circuit board, wherein the opening runs through the second circuit board;
  (B2) inserting a conductive structure in the opening, so that the conductive hole is formed; and
  (B3) partially cutting an edge of the second circuit board according to a size of the power device, so that the opening and the conductive structure are exposed to the lateral side of the second circuit board; and
(C) installing a welding element on the lateral side of the power device and the lateral side of the second circuit board, and contacting the welding element with the electrical contact and the conductive hole, wherein the first circuit board and the second circuit board are electrically connected with each other through the welding element.

8. The assembling method according to claim 7, wherein in the step (A), the first circuit board is disposed on the lateral side of the power device.

9. The assembling method according to claim 7, wherein in the step (A), the first circuit board is disposed on a bottom side of the power device, and the first circuit board is partially bent, so that the electrical contact is exposed to the lateral side of the power device.

10. The assembling method according to claim 7, wherein in the step (B3), a size of the second circuit board is equal to the size of the power device after the edge of the second circuit board.

* * * * *